(12) United States Patent
Noquil et al.

(10) Patent No.: US 11,177,197 B2
(45) Date of Patent: Nov. 16, 2021

(54) SEMICONDUCTOR PACKAGE WITH SOLDER STANDOFF

(71) Applicant: Texas Instruments Incorporated, Dallas, TX (US)

(72) Inventors: Jonathan Almeria Noquil, Plano, TX (US); Satyendra Singh Chauhan, Murphy, TX (US); Lance Cole Wright, Allen, TX (US); Osvaldo Jorge Lopez, Annandale, NJ (US)

(73) Assignee: Texas Instruments Incorporated, Dallas, TX (US)

( * ) Notice: Subject to any disclaimer, the term of this patent is extended or adjusted under 35 U.S.C. 154(b) by 104 days.

(21) Appl. No.: 16/581,971

(22) Filed: Sep. 25, 2019

(65) Prior Publication Data

US 2021/0090980 A1 Mar. 25, 2021

(51) Int. Cl.
*H01L 23/495* (2006.01)
*H01L 23/00* (2006.01)
(Continued)

(52) U.S. Cl.
CPC .. *H01L 23/49575* (2013.01); *H01L 23/49513* (2013.01); *H01L 23/49562* (2013.01); *H01L 24/32* (2013.01); *H01L 24/40* (2013.01); *H01L 24/41* (2013.01); *H01L 24/48* (2013.01); *H01L 24/73* (2013.01); *H01L 24/83* (2013.01); *H01L 24/84* (2013.01); *H01L 24/92* (2013.01); *H01L 25/074* (2013.01); *H01L 25/16* (2013.01); *H01L 25/50* (2013.01); *H01L 21/561* (2013.01); *H01L 21/565* (2013.01); *H01L 23/3121* (2013.01); *H01L 24/97* (2013.01); *H01L 2224/32245* (2013.01); *H01L 2224/40145* (2013.01); *H01L 2224/40177* (2013.01); *H01L 2224/4118* (2013.01); *H01L 2224/48091* (2013.01); *H01L 2224/48106* (2013.01); *H01L 2224/48137* (2013.01); *H01L 2224/48247* (2013.01); *H01L 2224/73221* (2013.01); *H01L 2224/73263* (2013.01); *H01L 2224/83815* (2013.01); *H01L 2224/84815* (2013.01); *H01L 2224/92246* (2013.01); *H01L 2924/13091* (2013.01);
(Continued)

(58) Field of Classification Search
USPC .......................................................... 257/676
See application file for complete search history.

(56) References Cited

U.S. PATENT DOCUMENTS 8,058,107 B2 11/2011 Cruz et al.
2008/0044946 A1* 2/2008 Cruz ....................... H01L 24/39
438/107
(Continued)

*Primary Examiner* — Nduka E Ojeh
(74) *Attorney, Agent, or Firm* — Ronald O. Neerings; Charles A. Brill; Frank D. Cimino

(57) ABSTRACT

A semiconductor package includes a leadframe including a die pad and a plurality of lead terminals. A vertical semiconductor device is attached on a first side by a die attach material to the die pad. A first clip is on the first vertical device that is solder connected to a terminal of the first vertical device on a second side opposite to the first side providing a first solder bonded interface, wherein the first clip is connected to at least a first of the lead terminals. The first solder bonded interface includes a first protruding surface standoff therein that extends from a surface on the second side of the first vertical device to physically contact the first clip.

24 Claims, 7 Drawing Sheets

(51) Int. Cl.
    *H01L 25/07*    (2006.01)
    *H01L 25/00*    (2006.01)
    *H01L 25/16*    (2006.01)
    *H01L 21/56*    (2006.01)
    *H01L 23/31*    (2006.01)

(52) U.S. Cl.
    CPC ................ *H01L 2924/1426* (2013.01); *H01L 2924/2064* (2013.01)

(56) References Cited

U.S. PATENT DOCUMENTS

| | | | |
|---|---|---|---|
| 2008/0224300 A1* | 9/2008 | Otremba | H01L 24/81 257/693 |
| 2013/0256852 A1* | 10/2013 | Wyant | H01L 24/84 257/670 |
| 2015/0287666 A1* | 10/2015 | Groenhuis | H01L 23/49524 257/676 |
| 2017/0207150 A1* | 7/2017 | Choi | H01L 23/49562 |
| 2018/0240770 A1* | 8/2018 | Choi | H01L 23/49575 |
| 2019/0088574 A1* | 3/2019 | Kim | H01L 23/49524 |

* cited by examiner

US 11,177,197 B2

SEMICONDUCTOR PACKAGE WITH SOLDER STANDOFF

FIELD

This Disclosure relates to semiconductor packages including at least one semiconductor die that includes solder connection(s).

BACKGROUND

Some semiconductor die packages use metal clips instead of wires to form internal connections to terminals on the semiconductor die and to provide external terminals, sometimes being called clip packages. For example some power packages include a single vertical field effect transistor (FET) die, while other power packages include multichip module (MCM) packages with laterally placed high side vertical FET die and low side vertical FET die FET die, while other MCM packages include vertically stacked FET die including a high side vertical FET die and a low side vertical FET die that conventionally include a plurality of clips. Clip packages generally have better electrical and thermal performance as compared to semiconductor die packages that utilize bond wire-based electrical connections.

Typically, conventional clip packages are designed into a customer's printed circuit boards (PCBs) because the circuit boards have unique footprints and pin assignments. When producing clip packages, one known problem is the forming of an uneven bond line thickness (BLT) of solder between the clip and the metal connections on the vertical die. When there is an uneven BLT of solder between a vertical die and a clip, the resulting semiconductor package may have clip and/or die tilting leading to thin solder regions, which may lead to reliability problems such as during heat cycling, and the power package may also exhibit degraded electrical performance such as due to solder cracking, which can lead to higher resistance or can cause shorts.

SUMMARY

This Summary is provided to introduce a brief selection of disclosed concepts in a simplified form that are further described below in the Detailed Description including the drawings provided. This Summary is not intended to limit the claimed subject matter's scope.

Disclosed aspects recognize semiconductor packages having vertical semiconductor die(s) (vertical die) with solder connections that utilize at least one clip may as assembled have an uncontrolled BLT of solder resulting in clip and die tilting. The cause of these problems is recognized to be because during a solder reflow process the solder reflow tends to move the clip and the vertical die in z (height) direction causing tilt, and as a result non-uniformity in the BLT of the solder.

As used herein the term "solder" includes conventional solder and solder derived from sintering a solder paste, whereas known in the art, solder paste is commonly applied to surface mount boards prior to pick and place, and when passed through an infra-red reflow machine, melts to provide the soldered joints. A disclosed aspect is to create a protruding standoff(s) on the surface of the vertical die that will maintain the BLT through the solder interface between the vertical die(s) and the clip. The standoff in one disclosed arrangement may provide an enclosure, such as being ring-shaped, but other disclosed arrangements may not provide an enclosure such as when the standoff is in the form of discrete posts, such as four posts with a post on all 4 corners of the vertical die, or six posts, depending on the specific die design. As used herein, a 'ring' means an enclosed shape such as being substantially circular such as elliptical, rectangular, or square. The height (thickness) of the standoff is generally at least equal to the solder thickness, and when the standoff is formed on the vertical die during wafer fabrication the dimensions (area and height) of the standoff can be more closely controlled due to better process control of deposition processes at the wafer/die level as compared to standoff formation during the assembly processing, such as standoffs formed by epoxy dispensing.

Disclosed aspects include a semiconductor package including a leadframe having a die pad and a plurality of lead terminals. A vertical semiconductor device is attached on a first side by a die attach material to the die pad. A first clip is on the first vertical device that is solder connected to a terminal of the first vertical device on a second side opposite to the first side providing a first solder bonded interface, wherein the first clip is connected to at least a first of the lead terminals. The first solder bonded interface includes a first protruding surface standoff therein that extends from a surface on the second side of the first vertical device to physically contact the first clip.

BRIEF DESCRIPTION OF THE DRAWINGS

Reference will now be made to the accompanying drawings, which are not necessarily drawn to scale, wherein:

FIG. 3C shows the front side of the die showing option 1 being where the standoff comprises an outer ring with another sub-ring around only a gate terminal of the die, while

DETAILED DESCRIPTION

Figure 1A:
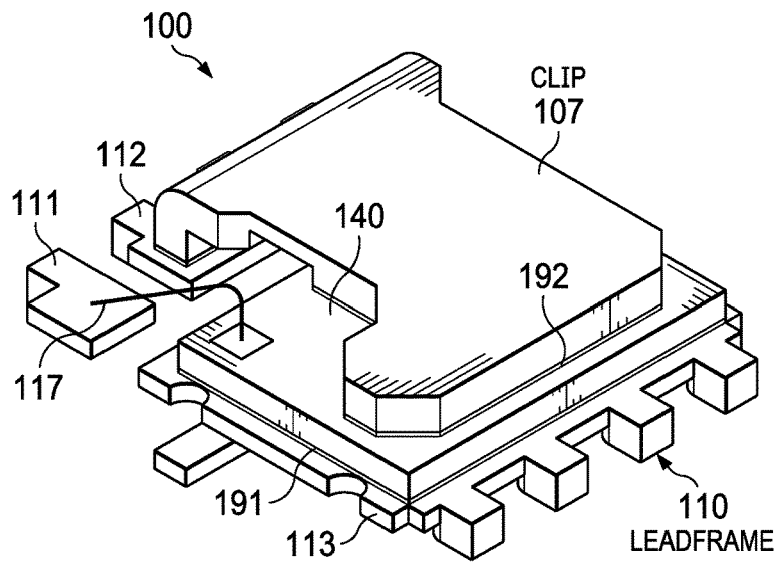
FIG. 1A is a top perspective view of an example semiconductor package without the mold compound not shown including a vertical semiconductor die connected to a clip by a solder connection that includes a solder standoff on both sides of the vertical semiconductor die, where the clip is coupled to a lead terminal of the leadframe.

Example aspects are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this Disclosure.

FIG. 1A is a top perspective view of an example semiconductor package 100 without the mold compound shown including a vertical semiconductor die 140 connected to a clip 107 by a solder bonded interface connection 192 that includes a protruding surface solder standoff (solder standoff) on both sides of the vertical semiconductor die 140 shown as 152 (on the top side) and 151 (on the back side). The clip 107 can comprise copper or a copper alloy. In FIG. 2A to FIG. 6 described below, the vertical semiconductor die 140 is described as being a low side FET die (LS FET) 140. The solder standoffs can be seen to extend the full distance from the top side of the vertical semiconductor die 140 to physically contact the clip 107. The vertical semiconductor die 140 comprises a three-terminal device, such as a bipolar device, a FET device such as a MOSFET device, or an insulated-gate bipolar transistor (IGBT) device. The vertical semiconductor die can comprise a silicon substrate, a III-V substrate such as gallium nitride, or a II-VI substrate.

The leadframe 110 includes a die pad 113 and a plurality of lead terminals with lead terminals 111 and 112 identified. The leadframe 110 generally comprises copper or a copper alloy. The semiconductor vertical die 140 is shown attached to the die pad 113 by a die attachment material shown as a solder bonded interface 191, that can also be a conductive epoxy die attach material. There is another solder bonded interface 192 between a top side of the vertical semiconductor die 140 in the clip 107. The clip 107 is shown coupled to lead terminal 112, with the solder for this connection shown in FIG. 1B described below as 194. Lead terminal 111 is connected by a bond wire 117 (e.g., a gold bond wire) to a terminal on the vertical semiconductor die 140 that in the case of a power FET die can be a gate terminal on its top side. For a conventional vertical power FET die, the die is a MOSFET die that has a gate and source terminal on the top side, and a drain terminal on its back side.

Figure 1B:
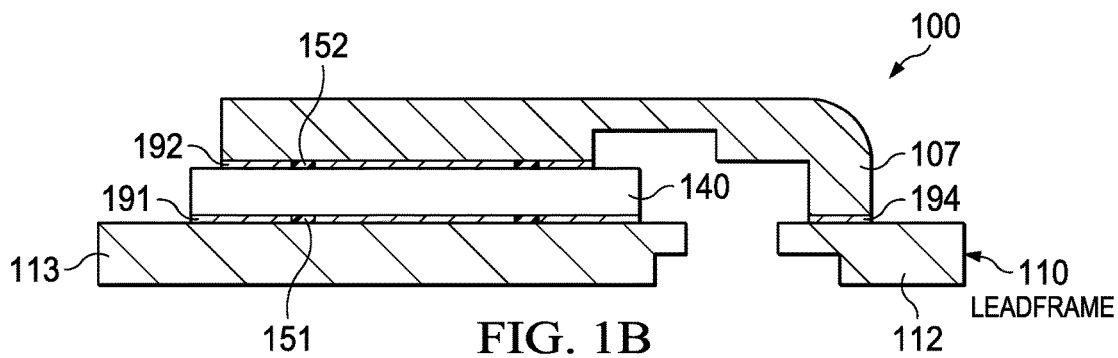
FIG. 1B is a cross-section view of the package shown in FIG. 1A again without the mold compound shown.

FIG. 1B is a cross-section view of the semiconductor package 100 shown in FIG. 1A again without the mold compound shown. The clip 107 is shown coupled to lead terminal 112 by a solder bonded interface 194. The solder standoffs on both sides of the vertical die 140 shown as 152 (on the top side) and 151 (on the back side) can clearly be seen in FIG. 1B that extend the full height of the solder bonded interface 191, 192, respectively.

Figure 1C:
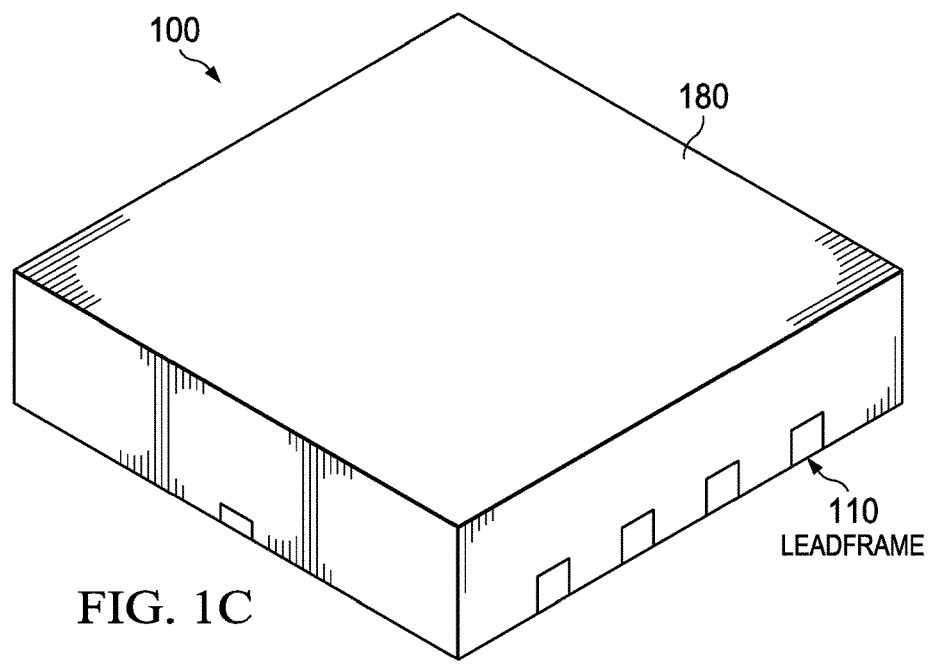
FIG. 1C is a top perspective view of the package shown in FIG. 1A with the mold compound now shown. The vertical semiconductor die is attached top side up to the leadframe, where the die has its back side attached to a die pad of the leadframe.

FIG. 1C is a top perspective view of the semiconductor package 100 shown in FIG. 1A with the mold compound 180 now shown. The package can be seen to be a leadless package. However, disclosed aspects can also include leaded packages.

Figure 2A:
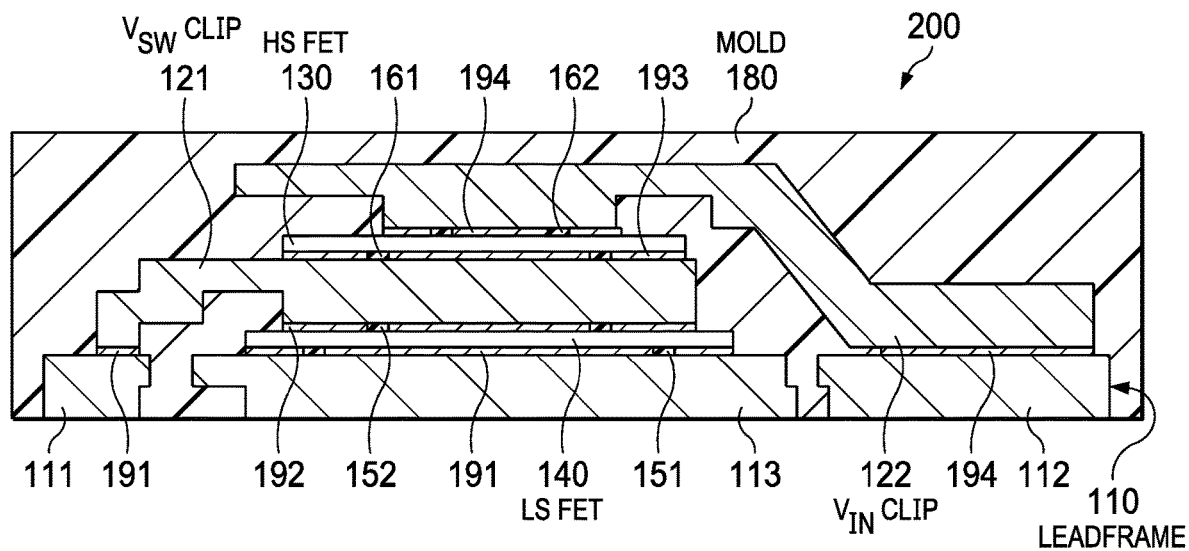
FIG. 2A is a cross-section view of a stacked die MCM power package including a high-side vertical FET die (HS FET) and low-side vertical FET die (LS FET) held in place by clips shown as a VSW clip and a VIN clip. Shown are three solder interfaces between the respective vertical FETs and the clips, with each solder bonded interface including disclosed protruding standoff(s).
Figure 4A:
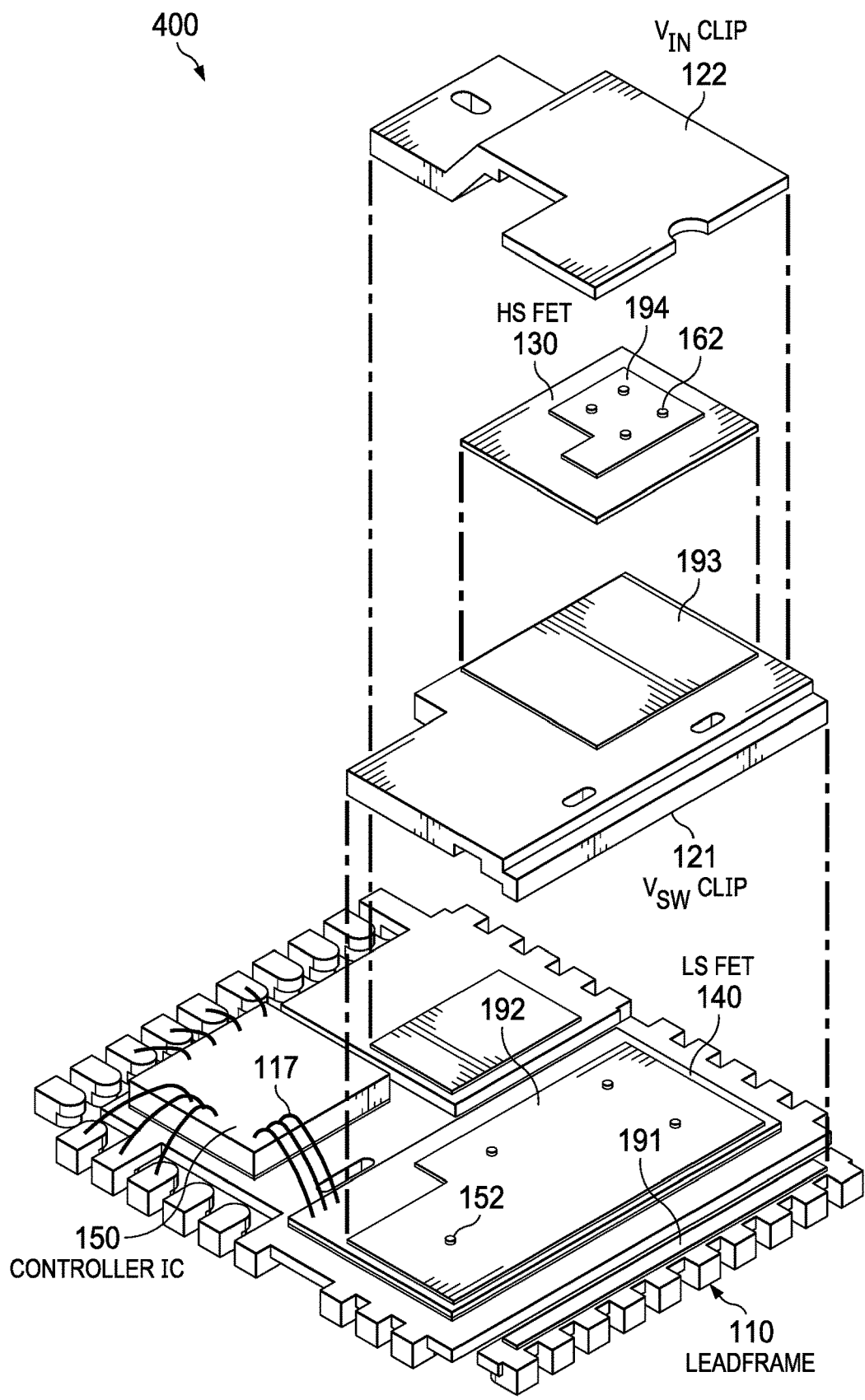
FIG. 4A is an exploded view of a disclosed stacked die MCM power package having an optional controller IC, shown wire bonded to the gate of the LS vertical FET, with bond wires from the controller IC to the gate of the HS FET not shown in FIG. 4A (due to the exploded view), with the vertical FET die each having disclosed standoffs shown as posts. Protruding standoffs shown as posts are shown on the top side of the HS FET and protruding standoffs shown as posts are shown on the top side of the LS FET.

FIG. 2A is a cross-section view of a stacked die MCM power package 200 (power package) including an HS vertical FET die (HS FET) 130 and LS vertical FET die (LS FET) 140 held in place by solder connections to clips (e.g. copper clips) shown as a VSW clip 121 and a Vin clip 122. There are generally also first and second gate clips for contacting the gates of the respective FETs that are not shown in FIG. 2A because FIG. 2A is a side cross-sectional view, where the respective gate contacts are on a side that is hidden in this view. However, in the case the MCM power package also includes a controller IC therein, such as shown in FIG. 4A described below, as an alternative to gate clips there may be bondwire connections between bond pads on the controller IC and bond pads providing the gate contacts for the vertical FETs.

The LS FET 140 is attached to a die pad 113 of a leadframe 110 that may be referred to as a foundational pad of the leadframe which provides the ground connection for the source of the LS FET 140 shown as S 142 in the circuit schematic of FIG. 2B described below. The leadframe 100 also includes lead terminals shown as 111 and 112. This package construction delivers substantial benefits in terms of board space savings, current levels, power efficiencies and thermal management. Because this bondwire-free arrangement enables reductions in electrical parasitic switching and conduction losses due to an elimination of bond wires, stacking two FETs 130, 140 in the package 200 achieves higher power conversion efficiencies when compared to a power converter that includes bond wires which implements two discrete laterally positioned FETs.

Shown in FIG. 2A are three solder interfaces between the respective FETs 130, 140 and the clips 121, 122. There are solder bonded interfaces shown as 191, 192 and 193, with each solder bonded interface including disclosed protruding standoffs shown as 151 within solder interface 191, protruding standoffs 152 within solder interface 192, protruding standoff 161 within solder interface 193, and protruding standoffs 162 in solder interface 194. Disclosed standoffs 151, 152, 161, 162 on the FET die 130, 140 surface improves the BLT of the solder bonded interface which if uneven in thickness as described above is a potential reliability risk. Although not shown in FIG. 2A, the lateral extent of the solder interfaces 191, 192, 193 can be all within the boundaries of their protruding standoffs.

The protruding standoffs 151, 152, 161, 162 can have a protruding height of 10 to 30 µm, such as 15 µm to about 25 µm. The standoffs generally comprise a dielectric material, such as comprising solder mask, dry film, polyimide, silicon nitrite, or silicon oxide, or an epoxy that can be printed or can be dispensed. The protruding standoff(s) in one aspect is circular in shape and is 0.1 to 0.3 mm in center diameter, again being about 15 µm to 25 um in standoff height. The standoff height is generally at least equal to the thickness of the solder bonded interfaces so that the protruding standoffs extend from the vertical semiconductor die surface to physically contact their respective clip.

The fabrication of protruding standoffs can be at the die level during wafer fabrication to achieve a thickness that is generally better than what can be achieved during formation during package assembly. In one particular arrangement the protruding standoffs are formed using one of the passivation layers in a two-layer passivation process, which can be part of the FET passivation mask used process to protect active, open electrical circuitry. The standoff can be also a printed epoxy on the plurality of die while in wafer form.

The protruding standoffs can be simultaneously formed on both the front side and the back side of the FET die where both solder bonded interfaces (front side contacting the clip and back side contacting a leadframe) can have a more uniform BLT of solder control (prevent die tilting and clip tilting). The material for the protruding standoff is generally selected so that it does not degrade or react (collapse) during a relatively high temperature (e.g., 240 to 250° C.) soldering reflow process during package assembly. The power package 200 is shown as a leadless package, including a mold compound 180 providing access to the back side of the die pad 113 (to provide what is generally referred to as a "power pad") and lead terminals 111, 112. As described above, the package can also be a leaded package.

Figure 2B:
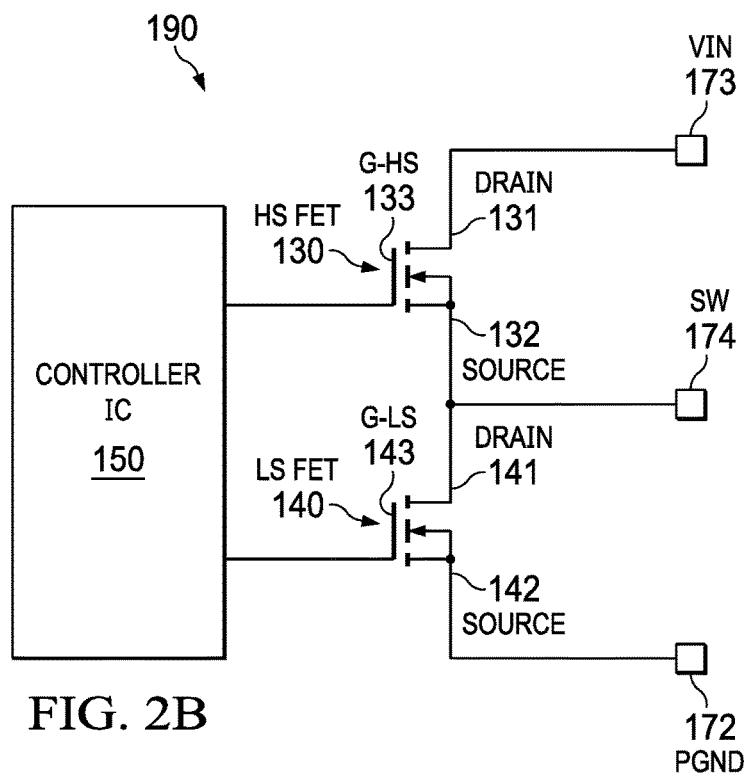
FIG. 2B shows an equivalent buck converter circuit that is implemented by the stacked die MCM power package shown in FIG. 2A having an added controller IC within the package that includes a gate driver which is coupled to drive the gates of the LS FET and the HS FET.

FIG. 2B shows an equivalent buck converter circuit 190 that is implemented by the power package 200 shown in FIG. 2A with an added controller IC 150 that includes a gate driver which is coupled to drive the gates of the LS FET 140 shown as G-LS 143 and the gate of the HS FET 130 shown as G-HS 133. The other terminals of the LS FET 140 shown include S 142 and D 141, and the other terminals of the HS FET 130 shown include D 131 and S 132. The switch node (SW) of the buck converter circuit 190 is shown as 174, the Vin node shown as 173, and the power ground (PGND) node is shown as 172. Although the respective FET are both shown as n-channel FETs, disclosed aspects can also utilize p-channel FETs.

Figure 3A:
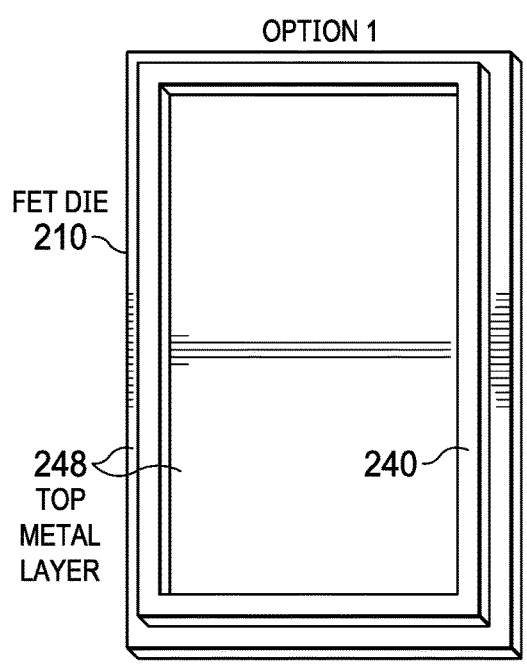
FIG. 3A shows the back side of a vertical FET die showing option 1 (ring-shaped standoff(s)) being where the standoff is configured as a ring around the periphery of the die.
Figure 3B:
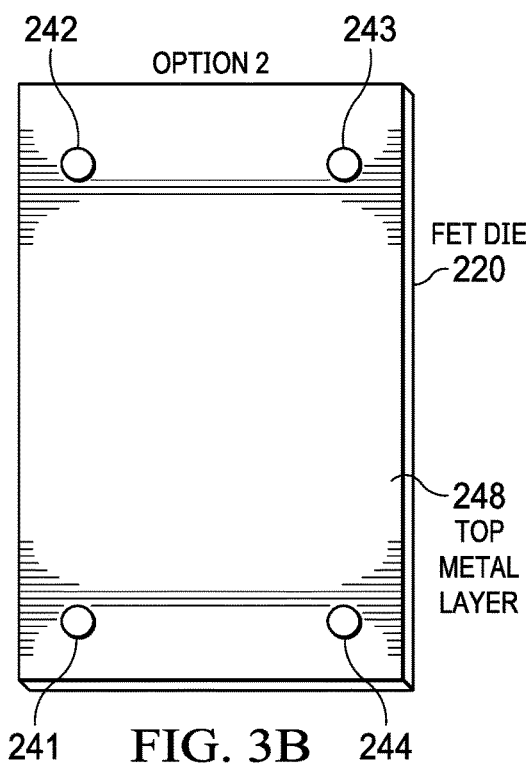
FIG. 3B shows the back side of a die showing option 2 being where the standoff configured to comprise posts shown on each of the 4 corners of the die.

FIG. 3A shows the back side of a vertical FET die 210 (that can be a drain) showing option 1 being where the protruding standoff is configured as a ring 240 around the periphery of the vertical FET die 210 over a top metal layer 248 that is a continuous sheet which generally extends over a full area on the back side of the die. FIG. 2B shows the back side of a vertical FET die 220 showing option 2 being where the protruding standoff is configured to comprise four posts 241, 242, 243 and 244 over a top metal layer 248 that extends over a full area on the back side of the die on each of the corners of the vertical FET die 220.

Figure 3C:
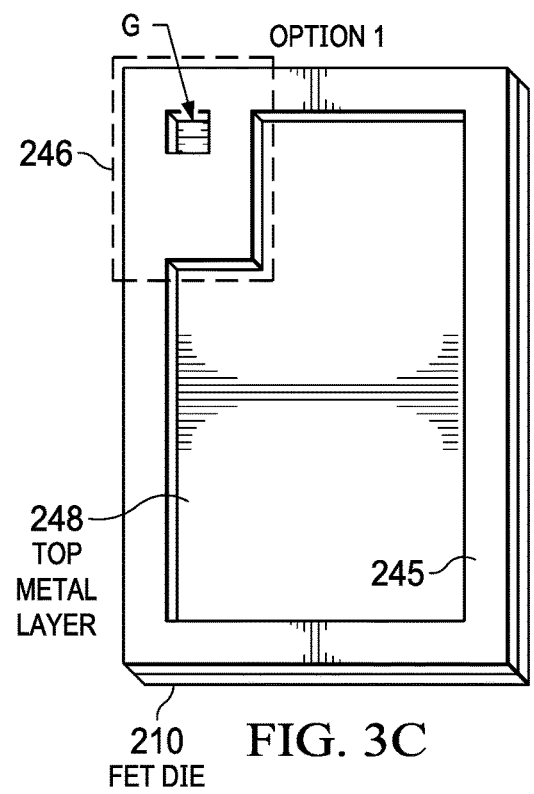

The top side of the vertical FET die generally includes two terminals for the FET including its gate and also its source or drain terminal depending on whether the die is an HS or is an LS die. FIG. 3C shows the top side of the vertical FET die 210 showing option 1 where the protruding standoff is an outer ring 245 over a top metal layer 248 that extends over a full area on the top side of the vertical FET die 210, where the outer ring 245 is along the perimeter of the vertical FET die 210 with another smaller area sub-ring 246 that utilizes a portion of the outer ring 245 that is around only a gate terminal of the vertical FET die 210 shown as G.

Figure 3D:
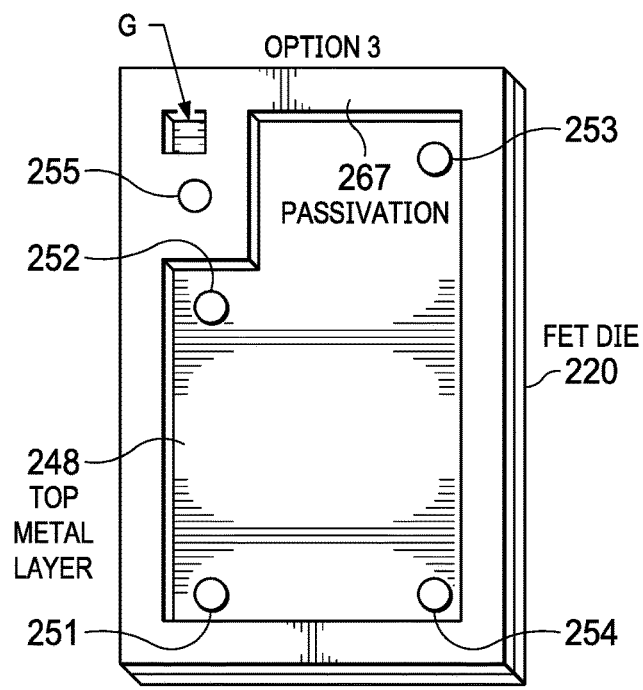
FIG. 3D shows the front side of a vertical FET die showing option 3 (both ring-shaped standoff(s) and posts) shown as four posts on top metal around the source or drain terminal, and a single post on passivation around the gate terminal.

FIG. 3D shows the top side of a vertical FET die 220 showing option 3 (ring-shaped standoff(s) and posts) where the protruding standoffs comprise four posts 251, 252, 253, and 254 on the top metal layer 248 around the source or drain terminal, and a single post 255 on the passivation layer 267 on one side of the gate terminal comprising the top metal layer 248 shown as G. As described above, in one arrangement, there is a two-layer passivation, where the passivation layer 267 is the first layer passivation, and the posts 251-254 comprise a second layer of passivation which protrudes above the first layer of passivation.

FIG. 4A is an exploded view of a disclosed stacked die MCM power package 400 having an optional controller IC 150 including a gate driver, shown bonded by bond wires to the gate terminal of the LS vertical FET 140, with bond wires from the controller IC 150 to the gate terminal of the HS FET 130 not shown in FIG. 4A, with the FET die 130, 140 each having disclosed protruding standoffs shown as posts. Protruding standoffs 162 shown as posts are shown on the top side of the HS FET 130, and protruding standoffs shown as posts 152 are shown on the top side of the LS FET 140. Bondwires are shown as 117.

Figure 4B:
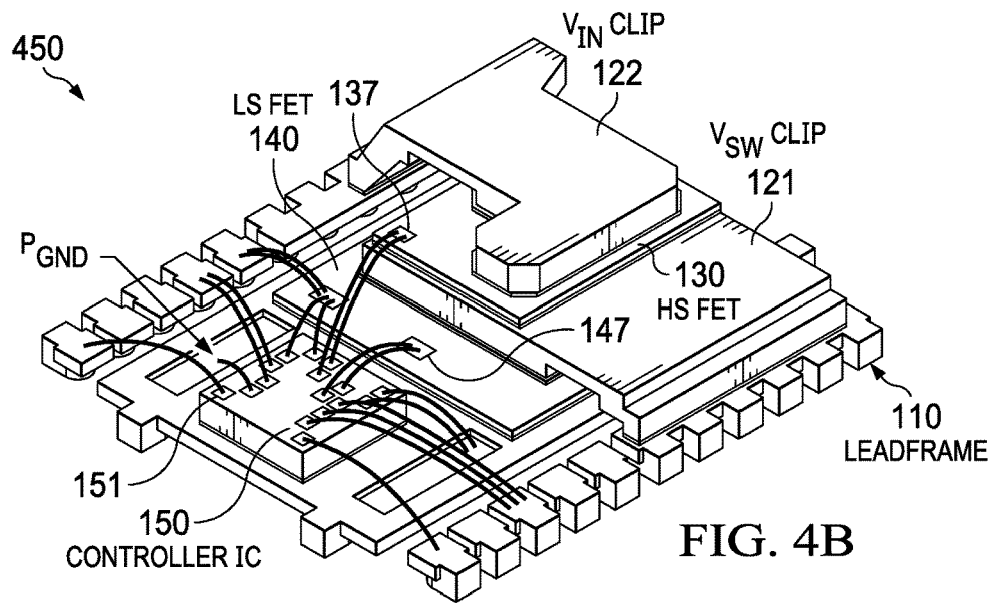
FIG. 4B shows a stacked die MCM power package having the optional controller IC shown in FIG. 4A therein, no longer shown exploded, where bond pads are now shown on the controller IC, on the LS FET, and on the HS FET. Although not revealed, there are generally disclosed protruding standoffs on both sides of the respective HS FET and the LS FET.

FIG. 4B shows a stacked die MCM power package 450 having an optional controller IC 150 shown in FIG. 4A, no longer shown exploded, where the bond pads 151 are now shown on the controller IC 150, bond pads 147 are shown on the LS FET 140, where bond pad 147 which can be to the G terminal, and the bond pads 137 are shown on the HS FET 130, where the bond pad 137 can be to the G terminal. Although not revealed, there are generally disclosed protruding standoffs on both sides of the respective HS FET die 140 and LS FET die 130, 140.

Figure 5A:
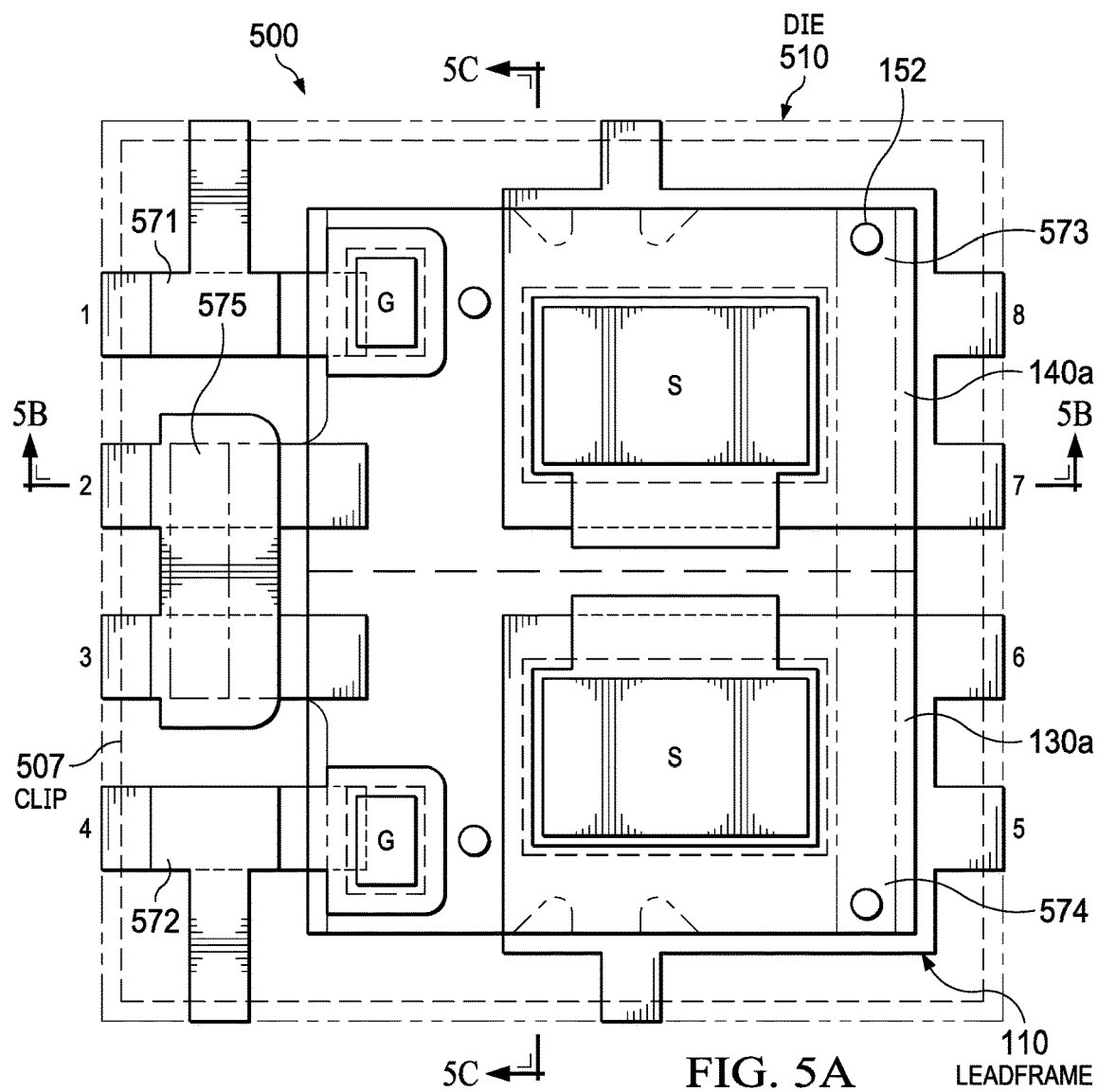
FIG. 5A is a top perspective view without mold compound shown of a semiconductor clip flipchip package including monolithic die having both a first vertical FET and a second vertical FET lateral to the first vertical FET, including disclosed standoffs on both its top side and back side, where the die is flipchip attached to clips that are coupled to terminals of the leadframe, and where the vertical FETs have their top side which is a common drain coupled by a single clip to 2 lead terminals of the leadframe.

FIG. 5A is a top perspective view without the mold compound shown of an 8-pin semiconductor clip package 500 having only a single die 510 (e.g., comprising silicon) including both a first vertical FET 130a and a second vertical FET 140a positioned lateral to one another, where the die 510 is flipchip attached to the leadframe 110. The gate G and source S terminals for each of the vertical FETs 130a, 140a are also identified in FIG. 5A for explanation purposes even though they would not be visible because they would be facing downward due to the flipchip arrangement. The first vertical FET 130a and the second vertical FET 140a have their back side which is a common drain facing up coupled by a clip shown as 507 (see the clip 507 in the cross section view in FIG. 5B described below) which is a common drain clip, that is shown coupled to lead terminals 2 and 3 of the leadframe 110. There are disclosed protruding surface standoffs 152, 151 on both the die's 510 top side and back side, with the protruding surface standoffs 152 only being shown in FIG. 5A. (But see the protruding surface standoffs 151 and 152 shown in FIG. 5B and FIG. 5C described below).

The die 510 is flipchip attached with its top side down having the G and S terminals of the first and second vertical FETs 130a and 140a onto the lead terminals 571, 572 (for the G's), and die pads 573 and 574 for the (S's). There is a clip 507 that spans essentially the full area of the die 510 that is positioned on top of the die 510, where the clip 507 is coupled to terminal 575 which connects to lead 2 and lead 3 of the semiconductor clip package 500 as shown. Lead terminal 571 is coupled to the G of the second vertical FET 140a, lead terminal 572 is coupled to the G of the first vertical FET 130a, die pad 573 is coupled to the S of the second vertical FET 140a, and the die attach pad 574 is coupled to an S of the first vertical FET 130a.

Figure 5B:
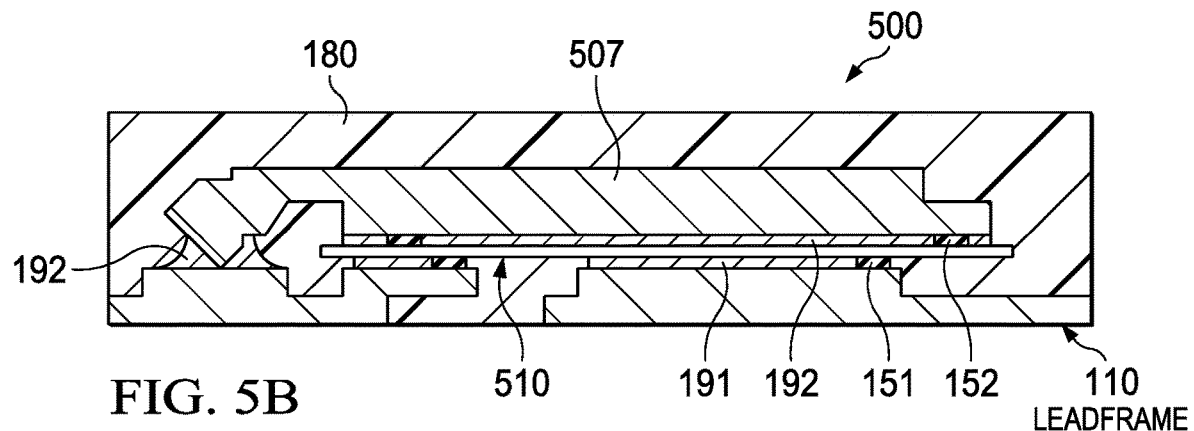
FIGS. 5B and 5C are cross-sectional views of the semiconductor clip flip to package shown in FIG. 5A along the cut lines 5B-5B and 5C-5C respectively, now showing the mold compound.
Figure 5C:
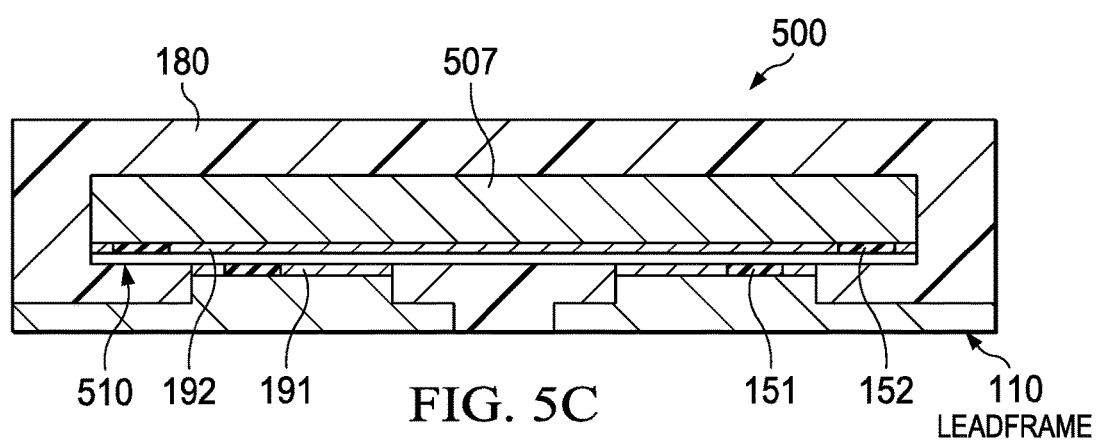

FIGS. 5B and 5C are cross-sectional views of the semiconductor clip package 500 shown in FIG. 5A along the cut lines 5B-5B and 5C-5C, respectively, that clearly show the clip 507 that connects to the common drain of the respective vertical FETs on top of the die 510 spans essentially the full area of the die 510. FIG. 5B also shows a solder bonded interface 192 besides being between the clip 507 and the die 510 also making a joint between the clip 507 and a terminal of the leadframe 110. Also shown is the protruding surface standoffs 152 and 151, as well as the first and second solder bonded interface 191 (for die attach) and solder bonded interface 192.

Figure 6:
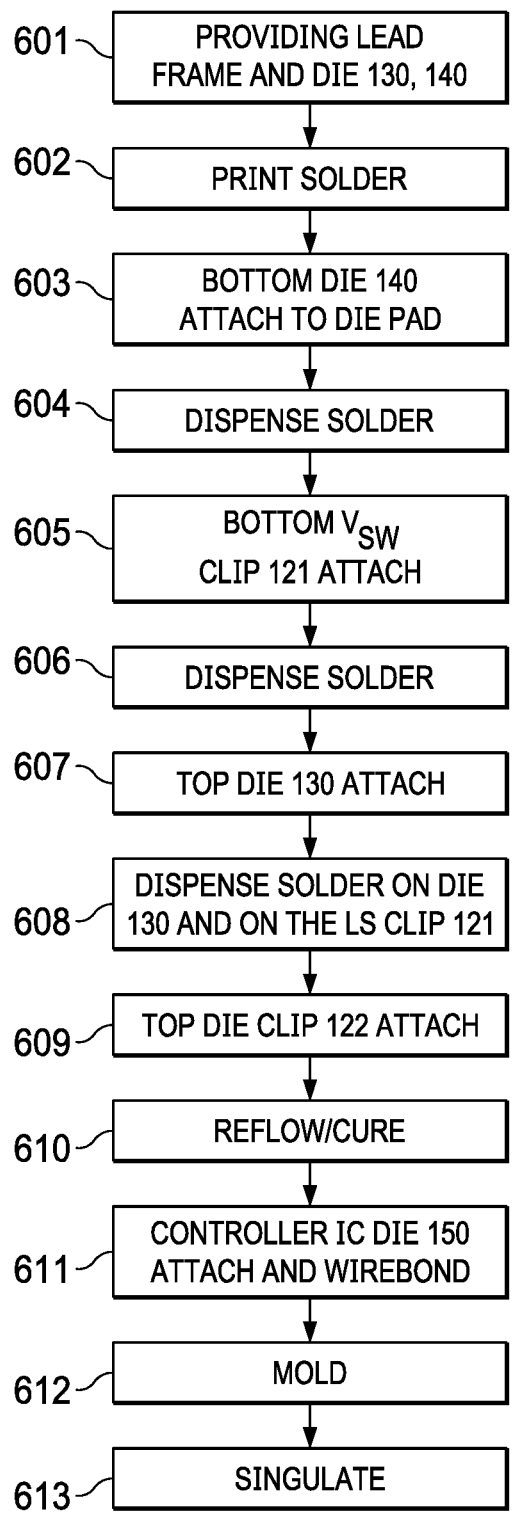
FIG. 6 shows an example assembly flow including steps for forming a stacked die MCM power package described above as stacked die MCM power package shown in FIG. 4A or the stacked die MCM power package shown in FIG. 4B.

FIG. 6 shows an example assembly flow including steps for forming a stacked die MCM power package described above as stacked die MCM power package 400 shown in FIG. 4A or stacked die MCM power package 450 shown in FIG. 4B. Step 601 comprises providing a leadframe including a die pad (such as the die pad 113 shown above) and a plurality of lead terminals, a first vertical FET such as HS FET 130, and a second vertical FET such as LS FET 140, wherein at least one of the first vertical FET and the second vertical FET include at least one side having a disclosed protruding surface standoff. As described above, the protruding surface standoffs can be formed while in wafer form during wafer fabrication operations, and are typically formed on both sides of the wafer including a plurality of the vertical semiconductor die.

As noted above, in one arrangement, the wafer fabrication sequence can utilize a thick passivation process that includes a first passivation process used to cover essentially the entire die and a second passivation process used to selectively increase the total thickness of the passivation in some areas of the die such as near the source (or drain) and gates terminals to be able to create disclosed protruding standoff(s). The respective passivation materials can comprise a polyimide, silica nitride, or silicon oxynitride. Another standoff formation process is to form the standoff(s) after the wafer fabrication, while still in wafer form. For example, by either depositing a polyimide material or any photo imageable material that can be deposited through spin coating or printing and curing by polymerization.

Step 602 comprises printing solder on the die pad. As an alternative to a solder die attach, a thermally conductive die attach material can be applied to the die pad, such as a silver filled epoxy. Step 603 comprises attaching the first vertical FET to the die pad, such as the LS FET 140. Step 604 comprises dispensing solder on the top surface of the first vertical FET and on the lead terminals. Step 605 comprises die attaching by solder connecting a bottom/first clip shown in FIG. 2A as the Vsw clip 121 to a terminal of the first vertical FET such as the drain 141 of the LS FET 140, to provide a first solder bonded interface, wherein the first clip such as clip 121 is connected to at least a first of the lead terminals.

Step 606 comprises dispensing solder on the first clip described as the Vsw clip 121, and step 607 comprises die attach by solder connecting a terminal of a second vertical power FET described above as HS FET 130 to the first clip 121 to provide a second solder bonded interface. Step 608 comprises dispensing solder, and step 609 comprises solder connecting a second clip to another terminal of the second vertical power FET to provide a third solder bonded interface, where the second clip shown above Vin clip 122 is connected to at least a first of the leads, wherein at least one of the first, the second, and the third FET/clip solder bonded interface include the protruding surface standoff therein. Step 610 comprises a reflow/cure, such as that about 240 to 250° C. for about 40 to 80 seconds. Step 611 comprises attaching the controller IC die having a gate driver shown above as 150 and then wirebonding to form wirebonds to connect the gate driver on the controller IC die to the respective gates on the FET die 130, 140. Step 612 comprises molding to form a mold compound, while step 613 comprises package singulation.

Disclosed aspects can be integrated into a variety of assembly flows to form a variety of different semiconductor device packages and related products. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, IGBT, CMOS, BiCMOS, and MEMS.

The invention claimed is:

1. A semiconductor package, comprising:
   a leadframe including a die pad and a plurality of lead terminals;
   a vertical semiconductor device attached on a first side by a die attach material to the die pad,
   a first clip on the first vertical device that is solder connected to a terminal of the vertical semiconductor device on a second side opposite to the first side providing a first solder bonded interface, wherein the first clip is connected to at least a first of the plurality of lead terminals;
   wherein the first solder bonded interface includes a first non-metallic protruding surface standoff therein that extends from a surface on the second side of the vertical device to physically contact the first clip.

2. The semiconductor package of claim 1, wherein the vertical semiconductor device comprises a vertical power field effect transistor (FET).

3. The semiconductor package of claim 1, wherein the vertical semiconductor device comprises a first vertical device and a second vertical device.

4. The semiconductor package of claim 3, wherein the first vertical semiconductor device and the second vertical semiconductor device are vertically stacked.

5. The semiconductor package of claim 3, wherein the first vertical semiconductor device and the second vertical semiconductor device are laterally positioned with respect to one another.

6. The semiconductor package of claim 1, wherein the first protruding surface standoff comprises a ring having a protruding height of 10 to 30 μm.

7. The semiconductor package of claim 1, wherein the vertical semiconductor device comprises a first vertical power field effect transistor (FET) and a second vertical power FET.

8. A multichip module (MCM) power package, comprising:
   a leadframe including a die pad and a plurality of lead terminals;
   stacked vertical power field effect transistors (FETs), comprising:
      a first vertical FET die attached to the die pad;
      a first clip on the first vertical FET die that is solder connected to a terminal of the first vertical FET die providing a first solder bonded interface, wherein the
first clip is connected to at least a first of the plurality
of lead terminals;
a second vertical FET die over the first clip having a
terminal solder connected to the first clip providing
a second solder bonded interface;
a second clip solder connected to another terminal of
the second vertical FET die to provide a third solder
bonded interface, where the second clip is connected
to at least a second of the plurality of lead terminals,
and
wherein at least one of the first, the second, and the
third solder bonded interfaces include a non-metallic
protruding surface standoff therein that extends from
a surface of the first or the second vertical FET die
to contact the first clip, or the second clip.

9. The MCM power package of claim 8, wherein the protruding surface standoff comprises a ring having a protruding height of 10 to 30 µm.

10. The MCM power package of claim 8, wherein the protruding surface standoff is circular in shape and has a center diameter of 0.1 to 0.3 mm, and has a protruding height of 10 to 30 µm.

11. A semiconductor package, comprising:
a leadframe including a die pad and a plurality of lead terminals;
a vertical semiconductor device attached on a first side by a die attach material to the die pad,
a first clip on the first vertical device that is solder connected to a terminal of the vertical semiconductor device on a second side opposite to the first side providing a first solder bonded interface, wherein the first clip is connected to at least a first of the plurality of lead terminals;
wherein the first solder bonded interface includes a first protruding surface standoff therein that extends from a surface on the second side of the vertical device to physically contact the first clip; and
wherein the die attach material comprises solder providing a second solder bonded interface, and wherein the second solder bonded interface includes a second protruding surface standoff therein that extends from the first side of the first vertical semiconductor device to physically contact the die pad.

12. A semiconductor package, comprising:
a leadframe including a die pad and a plurality of lead terminals;
a vertical semiconductor device attached on a first side by a die attach material to the die pad,
a first clip on the first vertical device that is solder connected to a terminal of the vertical semiconductor device on a second side opposite to the first side providing a first solder bonded interface, wherein the first clip is connected to at least a first of the plurality of lead terminals;
wherein the first solder bonded interface includes a first protruding surface standoff therein that extends from a surface on the second side of the vertical device to physically contact the first clip; and
wherein the first protruding surface standoff comprises a second layer of passivation on the first vertical semiconductor device that has a blanket first layer of passivation provided across an area of the second side except for bond pad areas under the second layer of passivation.

13. A multichip module (MCM) power package, comprising:
a leadframe including a die pad and a plurality of lead terminals;
stacked vertical power field effect transistors (FETs), comprising:
a first vertical FET die attached to the die pad;
a first clip on the first vertical FET die that is solder connected to a terminal of the first vertical FET die providing a first solder bonded interface, wherein the first clip is connected to at least a first of the plurality of lead terminals;
a second vertical FET die over the first clip having a terminal solder connected to the first clip providing a second solder bonded interface;
a second clip solder connected to another terminal of the second vertical FET die to provide a third solder bonded interface, where the second clip is connected to at least a second of the plurality of lead terminals;
wherein at least one of the first, the second, and the third solder bonded interfaces include a protruding surface standoff therein that extends from a surface of the first or the second vertical FET die to contact the first clip, or the second clip; and
a controller integrated circuit including a driver on the die pad, and bond wires coupling an output of the driver to a gate of the first vertical FET die and to a gate of the second vertical FET die.

14. A multichip module (MCM) power package, comprising:
a leadframe including a die pad and a plurality of lead terminals;
stacked vertical power field effect transistors (FETs), comprising:
a first vertical FET die attached to the die pad;
a first clip on the first vertical FET die that is solder connected to a terminal of the first vertical FET die providing a first solder bonded interface, wherein the first clip is connected to at least a first of the plurality of lead terminals;
a second vertical FET die over the first clip having a terminal solder connected to the first clip providing a second solder bonded interface;
a second clip solder connected to another terminal of the second vertical FET die to provide a third solder bonded interface, where the second clip is connected to at least a second of the plurality of lead terminals;
wherein at least one of the first, the second, and the third solder bonded interfaces include a protruding surface standoff therein that extends from a surface of the first or the second vertical FET die to contact the first clip, or the second clip; and
wherein first, the second, and the third solder bonded interfaces all include the protruding surface standoff.

15. A multichip module (MCM) power package, comprising:
a leadframe including a die pad and a plurality of lead terminals;
stacked vertical power field effect transistors (FETs), comprising:
a first vertical FET die attached to the die pad;
a first clip on the first vertical FET die that is solder connected to a terminal of the first vertical FET die providing a first solder bonded interface, wherein the first clip is connected to at least a first of the plurality of lead terminals;
a second vertical FET die over the first clip having a terminal solder connected to the first clip providing a second solder bonded interface;

a second clip solder connected to another terminal of the second vertical FET die to provide a third solder bonded interface, where the second clip is connected to at least a second of the plurality of lead terminals, and wherein at least one of the first, the second, and the third solder bonded interfaces include a protruding surface standoff comprising a solder mask, a dry film, a polyimide, silicon nitride, or an epoxy therein that extends from a surface of the first or the second vertical FET die to contact the first clip, or the second clip.

16. A multichip module (MCM) power package, comprising:
   a leadframe including a die pad and a plurality of lead terminals;
   stacked vertical power field effect transistors (FETs), comprising:
      a first vertical FET die attached to the die pad;
      a first clip on the first vertical FET die that is solder connected to a terminal of the first vertical FET die providing a first solder bonded interface, wherein the first clip is connected to at least a first of the plurality of lead terminals;
      a second vertical FET die over the first clip having a terminal solder connected to the first clip providing a second solder bonded interface;
      a second clip solder connected to another terminal of the second vertical FET die to provide a third solder bonded interface, where the second clip is connected to at least a second of the plurality of lead terminals;
   wherein at least one of the first, the second, and the third solder bonded interfaces include a protruding surface standoff therein that extends from a surface of the first or the second vertical FET die to contact the first clip, or the second clip; and
   wherein the protruding surface standoff comprises a second layer of passivation on at least one of the first and second vertical FET die that has a first layer of passivation under the second layer of passivation.

17. A method of semiconductor device package assembly, comprising:
   providing a leadframe including a die pad and a plurality of lead terminals, a vertical semiconductor device including a first side and a second side including one of the first side and the second side having a non-metallic protruding surface standoff;
   attaching the first side of the first vertical semiconductor device using a die attach material to the die pad;
   solder connecting a first clip to a terminal on the second side of the first vertical semiconductor device to provide a first solder bonded interface, wherein the first clip is connected to at least one of the plurality of lead terminals.

18. The method of claim 17, wherein the first vertical semiconductor device comprises a first vertical power field effect transistor (FET).

19. The method of claim 18, further comprising assembling a second vertical power FET device on the first clip.

20. The method of claim 19, further comprising attaching a controller integrated circuit including a driver on the die pad, and positioning bond wires coupling an output of the driver to a gate of the first vertical FET and to a gate of the second vertical FET.

21. The method of claim 17, further comprising assembling a second vertical device laterally positioned with respect to the first vertical device.

22. The method of claim 17, wherein the protruding surface standoff comprises a ring having a protruding height of 10 to 30 μm.

23. A method of semiconductor device package assembly, comprising:
   providing a leadframe including a die pad and a plurality of lead terminals, a vertical semiconductor device including a first side and a second side including one of the first side and the second side having a protruding surface standoff;
   attaching the first side of the first vertical semiconductor device using a die attach material to the die pad;
   solder connecting a first clip to a terminal on the second side of the first vertical semiconductor device to provide a first solder bonded interface, wherein the first clip is connected to at least one of the plurality of lead terminals, wherein the die attach material comprises solder providing a second solder bonded interface, and wherein the second solder bonded interface includes another protruding surface standoff therein that extends from the first side of the first vertical semiconductor device to physically contact the die pad.

24. A method of semiconductor device package assembly, comprising:
   providing a leadframe including a die pad and a plurality of lead terminals, a vertical semiconductor device including a first side and a second side including one of the first side and the second side having a protruding surface standoff;
   attaching the first side of the first vertical semiconductor device using a die attach material to the die pad; and
   solder connecting a first clip to a terminal on the second side of the first vertical semiconductor device to provide a first solder bonded interface, wherein the first clip is connected to at least one of the plurality of lead terminals, wherein the protruding surface standoff comprises a second layer of passivation on the first vertical semiconductor device that has a blanket first layer of passivation provided across an area of the second side except for bond pad areas under the second layer of passivation.

* * * * *